United States Patent
Wiggins et al.

(10) Patent No.: US 9,972,914 B2
(45) Date of Patent: May 15, 2018

(54) MONOPOLE ARRAY ARRANGEMENT, COMPUTER-ACCESSIBLE MEDIUM AND METHOD FOR USING THE SAME

(71) Applicant: NEW YORK UNIVERSITY, New York, NY (US)

(72) Inventors: Graham Charles Wiggins, New York, NY (US); Gang Chen, New York, NY (US)

(73) Assignee: New York University, New York, NY (US)

( * ) Notice: Subject to any disclaimer, the term of this patent is extended or adjusted under 35 U.S.C. 154(b) by 716 days.

(21) Appl. No.: 14/543,165

(22) Filed: Nov. 17, 2014

(65) Prior Publication Data

US 2015/0137816 A1 May 21, 2015

Related U.S. Application Data

(60) Provisional application No. 61/904,676, filed on Nov. 15, 2013.

(51) Int. Cl.
*G01V 3/00* (2006.01)
*H01Q 21/00* (2006.01)
(Continued)

(52) U.S. Cl.
CPC ......... *H01Q 21/00* (2013.01); *G01R 33/3415* (2013.01); *G01R 33/34038* (2013.01); *H01Q 9/30* (2013.01); *H01Q 21/205* (2013.01)

(58) Field of Classification Search
CPC ......... H01Q 21/00; H01Q 9/30; H01Q 21/205
(Continued)

(56) References Cited

U.S. PATENT DOCUMENTS 6,661,229 B2 * 12/2003 Weyers ............ G01R 33/34046
324/318
7,439,736 B2 * 10/2008 Meaney .................. A61B 5/05
324/307
(Continued)

OTHER PUBLICATIONS

"The Monopole Antenna", 2009-2011, http://www.antenna-theory.com/antennas/monopole.php.*
(Continued)

*Primary Examiner* — Susan Lee
(74) *Attorney, Agent, or Firm* — Hunton Andrews Kurth LLP (57) ABSTRACT

An array arrangement according to an exemplary embodiment of the present disclosure can be provided. For example, the array arrangement can include a monopole array having a first end and a second end. The monopole array can be configured to be driven from the first end and from the second end. Further, a monopole array can be provided according to another exemplary embodiment of the present disclosure. For example, the monopole array can include a first monopole element can include a first antenna element, and a first grounding element in communication with the first antenna element. The monopole array can also include a second monopole element including a second antenna element, and a second grounding element in communication with the second antenna element. The first antenna element can be oriented in a first direction, and the second antenna element can be oriented in a second direction.

7 Claims, 11 Drawing Sheets

(51) Int. Cl.
*G01R 33/34* (2006.01)
*G01R 33/3415* (2006.01)
*H01Q 9/30* (2006.01)
*H01Q 21/20* (2006.01)

(58) Field of Classification Search
USPC ........................................... 324/322
See application file for complete search history.

(56) References Cited

U.S. PATENT DOCUMENTS

| | | | |
|---|---|---|---|
| 8,427,158 B2 * | 4/2013 | Huish | G01R 33/34007 324/318 |
| 2006/0038564 A1 * | 2/2006 | Findeklee | G01R 33/34046 324/318 |
| 2008/0122729 A1 * | 5/2008 | Philippakis | H01Q 1/007 343/876 |
| 2010/0253338 A1 * | 10/2010 | Eryaman | G01R 33/285 324/309 |
| 2012/0223709 A1 * | 9/2012 | Schillak | G01R 33/3607 324/309 |

OTHER PUBLICATIONS

Lattanzi R. et al "Ideal Current Patterns Yielding Optimal SNR & SAR in Magnetic Resonance Imaging: Computational Methods and Physical Insights" MRM, 68: p. 286-304, 2012.

Suk-Min Hong et al "New design concept of monopole antenna array for UHF 7T MRI" Magn. Reson Med. May 2014;71(5):1944-52.

Klose U,"Mapping of the radio frequency manetic field wit ha MR snapshot Flash technique" Med. Phys. 19(4), 1992.

* cited by examiner

MONOPOLE ARRAY ARRANGEMENT, COMPUTER-ACCESSIBLE MEDIUM AND METHOD FOR USING THE SAME

CROSS-REFERENCE TO RELATED APPLICATION(S)

This application relates to and claims priority from U.S. Patent Application No. 61/904,676, filed on Nov. 15, 2014, the entire disclosure of which is incorporated herein by reference.

STATEMENT REGARDING FEDERALLY SPONSORED RESEARCH

The invention was made with the U.S. Government support under Grant Nos. ROI AR056260 and ROI AR060238 awarded by the National Institutes of Health. Thus, the U.S. Government has certain rights in this invention.

FIELD OF THE DISCLOSURE

The present disclosure generally relates to a medical imaging apparatus and in particular to exemplary embodiments of exemplary embodiments of a monopole array arrangement, computer-accessible medium and method for using the same.

BACKGROUND INFORMATION

A monopole antenna is a class of radio antenna which can include a straight rod-shaped conductor that can be mounted perpendicularly over some type of conductive surface (e.g., a ground plane). The driving signal from the transmitter can be applied, or for receiving antennas the output signal to the receiver can be taken, between the lower end of the monopole and the ground plane. One side of the antenna feedline can be attached to the lower end of the monopole, and the other side can be attached to the ground plane, which can often be the Earth. This can be different than a dipole antenna that can consist of two identical rod conductors, with the signal from the transmitter applied between the two halves of the antenna.

All of the monopole elements can share the same ground plane, which can increase coupling between the elements. Additionally, monopole elements can be driven from a single side and the signal can drop off quickly along the monopole element, which can result in a low signal at the end of the monopole.

Thus, it may be beneficial to provide an exemplary monopole array arrangement and a method for using the same, which can overcome at least some of the deficiencies described herein above.

SUMMARY OF EXEMPLARY EMBODIMENTS

An exemplary multichannel (e.g., 8, 16, 32 channels) monopole coil array (e.g., a Transmit-Receive "TxRx" array), according to an exemplary embodiment of the present disclosure, can be provided that can be driven from opposing ends of the array. The exemplary monopole array can include a strip of conducting material that can replace the ground plane. Such exemplary configuration can facilitate the size of the ground plane to be significantly reduced, and the exemplary monopole coil array can be driven from multiple sides, which can assist in preventing and/or reducing B1+ rapid drop off on either side of the monopole.

To that end, an array arrangement according to an exemplary embodiment of the present disclosure can be provided. For example, the array arrangement can include a monopole array having a first end and a second end. The monopole array can be configured to be driven from the first end and from the second end. Further, a monopole array can be provided according to another exemplary embodiment of the present disclosure.

For example, the monopole array can include a first monopole element which can include a first antenna element, and a first grounding element in communication with the first antenna element. The monopole array can also include a second monopole element which can include a second antenna element, and a second grounding element in communication with the second antenna element. The first antenna element can be oriented in a first direction, and the second antenna element can be oriented in a second direction.

Certain exemplary embodiments of the present disclosure can include an array arrangement, which can include a monopole array having a first end and a second end; the monopole array can be configured to be driven from the first end and from the second end. In some exemplary embodiments of the present disclosure, the first end can be provided opposite to the second end. The monopole array can include at least two monopole elements. One of the monopole elements can be located at the first end, and another one of the monopole elements can be located at the second end. A ground element(s) can be coupled to the monopole elements. The grounding element(s) can be coupled to the monopole elements using a fitting(s). The fitting can be configured to provide a signal(s) between the monopole elements and the grounding element(s). The monopole elements can be T shaped, and the grounding element(s) can be positioned substantially perpendicular to the monopole elements.

In some exemplary embodiments of the present disclosure, a free end of the first end can be positioned adjacent a fixed end of the second end. The monopole array can be configured to transmit or receive a magnetic resonance signal(s). The monopole array can include an antenna element(s). The antenna(s) element can be a rod conductor. A computer arrangement can be configured to receive magnetic resonance information from the monopole array and generate an image(s) based on the information.

A further exemplary embodiments of the present disclosure can include a monopole array, which can include a first monopole element including a first antenna element(s), and a first grounding element in communication with the first antenna element(s), and a second monopole element including a second antenna element(s), and a second grounding element in communication with the second antenna element(s); The first antenna element(s) can be oriented in a first direction, and the second antenna element(s) can be oriented in a second direction that can be different from the first direction. The first antenna element can extend in a direction that can be substantially perpendicular to a direction of extension of the first grounding element, and the second antenna element can extend in a direction that can be substantially perpendicular to a direction of extension of the second grounding element. The first antenna element(s) can be coupled to the first grounding element using a first fitting, and the second antenna element(s) can be coupled to the second grounding element using a second fitting.

In certain exemplary embodiments of the present disclosure, the first antenna element(s) can include a plurality of first antenna elements spaced apart from one another along the first grounding element, and the second antenna element(s) can include a plurality of second antenna elements spaced apart along the second grounding element. The first grounding element can include a space configured to facilitate an anatomical object to pass therethrough. The first and second monopole elements can be configured to transmit and/or receive a magnetic resonance signal(s).

Another exemplary embodiment of the present disclosure can include a computer-accessible medium for generating an image(s), which can include, for example, receiving magnetic resonance imaging information from an array arrangement, which can include a monopole array having a first end and a second end. The monopole array can be configured to be driven from the first end and from the second end.

These and other objects, features and advantages of the present disclosure will become apparent upon reading the following detailed description of exemplary embodiments of the present disclosure, when taken in conjunction with the accompanying exemplary drawings and appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure.

Throughout the drawings, the same reference numerals and characters, unless otherwise stated, are used to denote like features, elements, components or portions of the illustrated embodiments. Moreover, while the present disclosure will now be described in detail with reference to the figures, it is done so in connection with the illustrative embodiments and is not limited by the particular embodiments illustrated in the figures or provided in the appended claims.

DETAILED DESCRIPTION OF EXEMPLARY EMBODIMENTS

According to exemplary embodiments of the present disclosure, an exemplary monopole array can be provided that can be driven from opposite ends. In certain exemplary embodiments of the present disclosure, the exemplary monopole array can include two or more monopole elements that each can include an antenna element and a grounding element. The antenna element and grounding element can be connected together with a fitting that can transmit signals therebetween. Neighboring monopole elements can be arranged in opposite orientations relative to one another, such that a free end of a first monopole element can be positioned adjacent a fixed end of a second monopole element. For example, each exemplary monopole element can be "T" shaped with the grounding element positioned perpendicular to the grounding element. The monopole element is positioned so that it can be aligned with the main $B_0$ static magnetic field of the scanner. The exemplary grounding elements of adjacent monopole elements can be positioned on opposite ends and the grounding elements of every other monopole element can be connected together or left separate with a gap between them, with adjacent monopole elements being connected to a grounding element on opposite ends of the exemplary array.

In certain exemplary embodiments of the present disclosure, arrangements, methods of making/using arrangements, and/or computer readable mediums can be provided which can include and/or utilize an array arrangement that can include a plurality of monopole antenna elements configured to transmit and/or receive at least one magnetic resonance signal. According to further exemplary embodiments of the present disclosure, a processing arrangement can be provided that can be configured to determine a magnetic resonance image based on the magnetic resonance signal(s). In certain exemplary embodiments, the monopole antenna elements can have alternating orientations. For example, the ground elements (e.g., a conducting strip) of adjacent antenna elements can be positioned on opposite ends of the antenna elements from one another. Further, the exemplary combination of the antenna element with its respective ground element can form a "T" shape, and adjacent elements can be oriented in the opposite manner from each other.

Using exemplary alternating orientations of the grounding elements, for example, the exemplary monopole elements of the exemplary array can be driven from opposing ends, which can assist in preventing, or significantly reducing, B1+ drop off from either side of the monopole array. Additionally, because in one exemplary embodiment, the grounding elements of adjacent monopoles are separated and disconnected from one another, coupling between adjacent monopole elements can be reduced.

Figure 1:
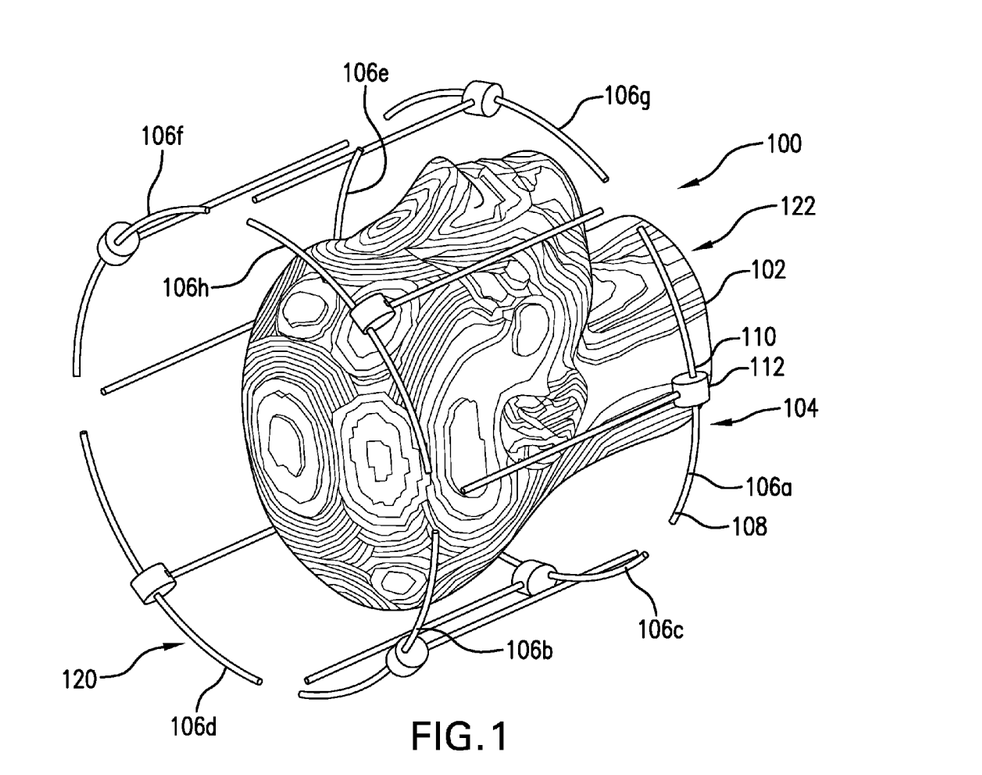
FIG. 1 is a perspective view of an exemplary monopole array according to an exemplary embodiment of the present disclosure, with a subject positioned within the array.
Figure 2:
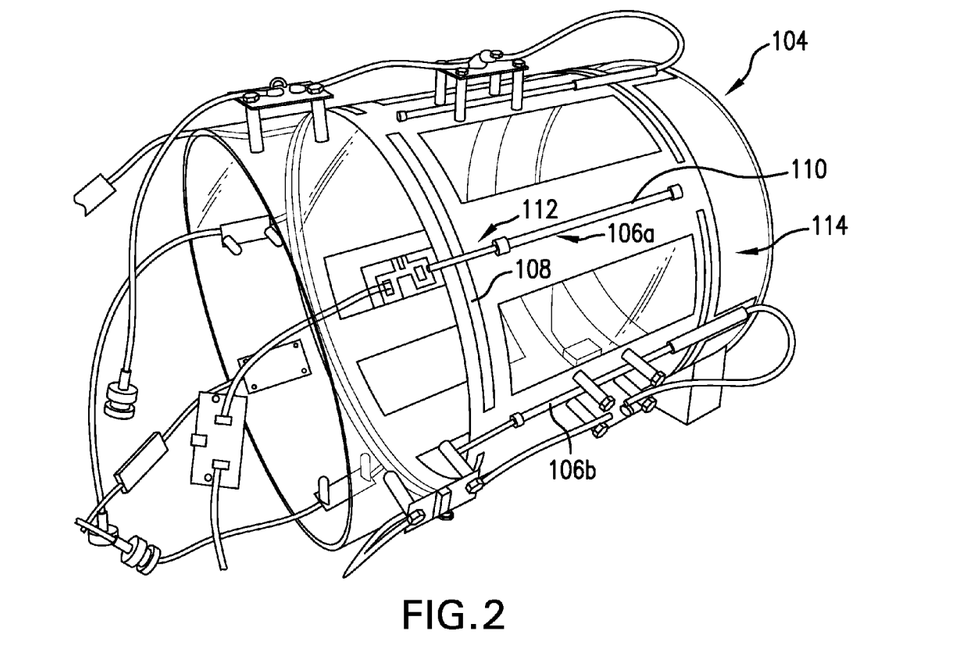
FIG. 2 is an image of a perspective view of the exemplary monopole array of FIG. 1.
Figure 3:
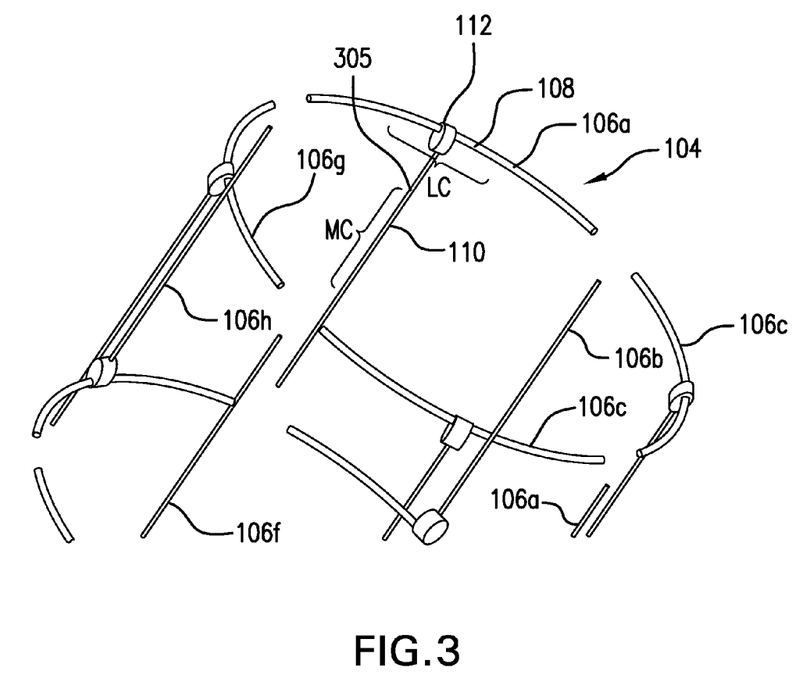
FIG. 3 is an illustration of the average current density on the monopole array of FIG. 1 when a single element is excited with radio frequency ("RF") energy.

Turning to the figures, an exemplary monopole array according to an exemplary embodiment of the present disclosure will now be discussed in further detail. FIG. 1 shows a perspective view of an exemplary representation of a system 100 for magnetic resonance imaging ("MRI") which includes an exemplary monopole array 104, according to an exemplary embodiment of the present disclosure. FIG. 2 is an image of a perspective view of the exemplary monopole array 104 from the system shown 100 illustrated in FIG. 1. For example, the system 100 can include the exemplary monopole array 104 and a test subject 102 (e.g., person or a portion thereof). The monopole array 104 can include a plurality of monopole elements 106a-106h spaced apart so as to define a cage around the test subject 102. The monopole elements 106a-106h can be supported on a substrate 114 or other support structure to define a cavity in which the test subject 102 or a portion thereof (e.g., head, arm, leg, etc.) can be positioned. (See, e.g., FIG. 2). There can be any suitable number of exemplary monopole elements 106a-106h. For example, there can be 2, 4, 6, 8, 12, 32 or more monopole elements. For example, there can be an even number of monopole elements 106a-106b as illustrated in FIGS. 1-3.

As shown in FIGS. 1 and 2, each monopole element 106a-106h can include an antenna element 110, and a grounding element 108. The antenna element 110, (e.g., rungs), and the grounding element 108, can be in communication with one another, and can be secured together with any suitable fitting (e.g., fitting 112). In the exemplary monopole array 104, the antenna element 110 and the grounding element 108 can be orientated perpendicularly to one another, and can define an intersecting shape (e.g., a "T" shape, or any other suitable shape). The exemplary antenna elements 110 can be, or can include, a rod conductor that can facilitate a transmission and/or a receipt of a signal. Therefore, the exemplary rod can function as both a Tx and Rx element. The grounding elements 108 can be, or can include, conductive strips that can form a virtual grounding plane. The fittings 112 can act as a signal feed point for the antenna elements 110.

Figure 4:
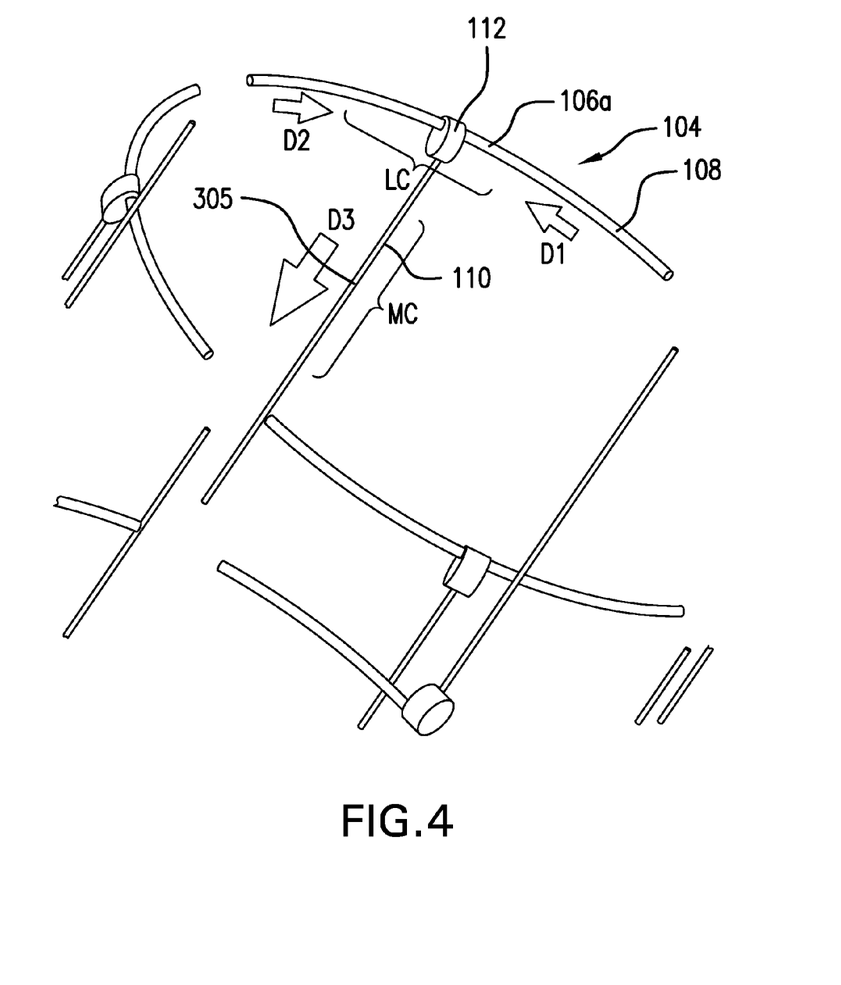
FIG. 4 is an enlarged view of the average current density shown in FIG. 3, with arrows depicting the direction of flow on the monopole and on the ground strip at a particular point in the RF cycle.

In an exemplary operation, the exemplary monopole array 104 can be driven to provide signals to the exemplary monopole elements 106a-106h. FIGS. 3 and 4 show exemplary views of the exemplary monopole array, according to an exemplary embodiment of the present disclosure, during an exemplary operation, which shows a current flow 305 between the various elements. With reference to FIGS. 3 and 4, during a drive mode, a driving signal can be communicated, via the fitting 112, to the antenna element 110. The locations marked high current HC can have a higher current flowing therethrough than the locations marked low current LC. For example, the antenna elements 106a-106h can have a higher current flowing therethrough than the grounding elements 108, which can form an end ring for the exemplary monopole array 104.

Figure 5:
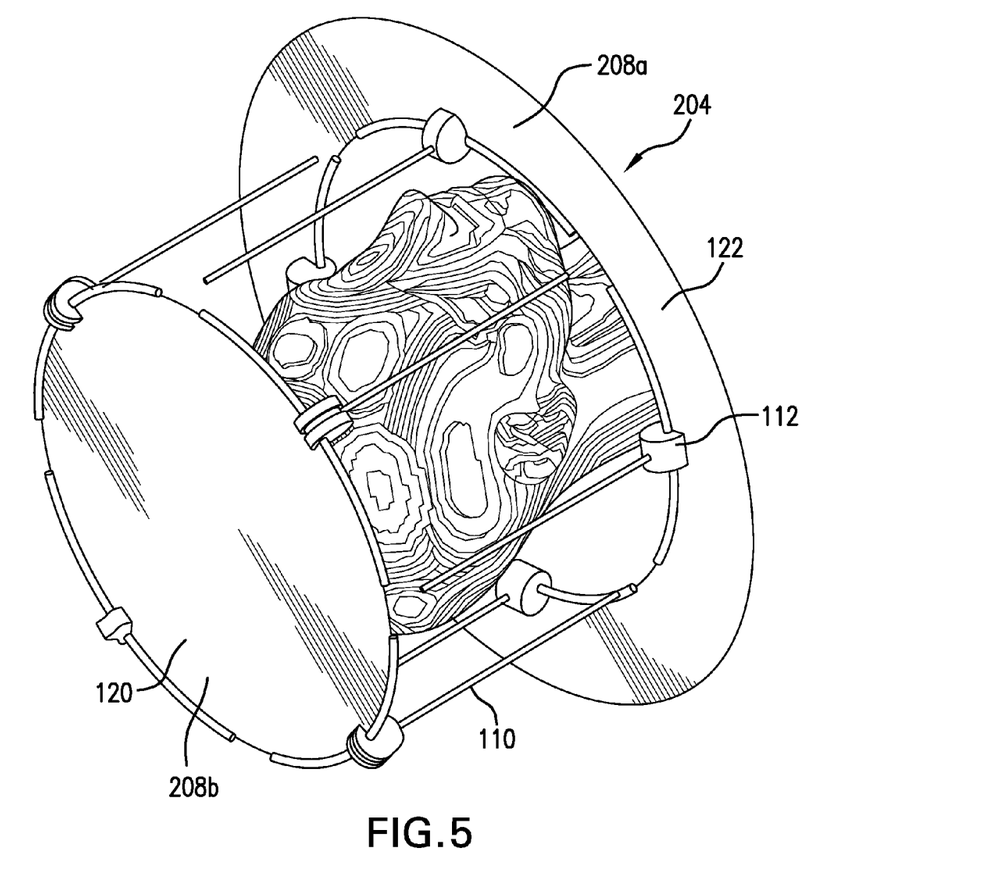
FIG. 5 is a perspective view of the exemplary monopole array according to an exemplary embodiment of the present disclosure.
Figure 6:
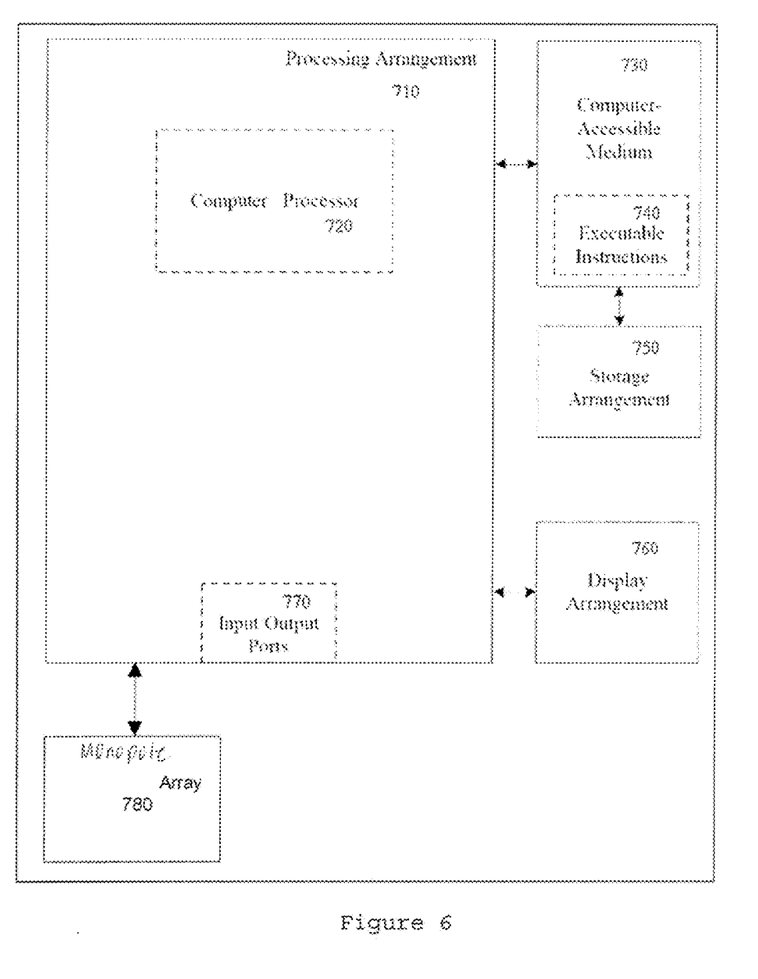
FIG. 6 is an illustration of an exemplary block diagram of an exemplary system, according to an exemplary embodiment of the present disclosure.

With reference to FIGS. 1-4, the exemplary monopole array 104 can include grounding elements 108 on both a first end 120 and a second end 122. The exemplary grounding elements 108 on the first end 120 can form a first end ring, and the grounding elements 108 on the second end 122 can form a second end ring. FIG. 5 shows another exemplary embodiment of the present disclosure, in which the grounding elements for each respective end 120 and 122 can be interconnected together. For example, in this exemplary monopole array 204, the first end 120 can include a single grounding element 208a that can be interconnected to a plurality of antenna elements 110, and the second end 122 can include a single grounding element 208b that can be interconnected to a plurality of antenna elements 110. In this exemplary embodiment, adjacent antenna elements 110 can be connected to opposite grounding elements 208a and 208b such that adjacent antenna elements 110 can be oriented in opposing directions.

Although the grounding element 208b is illustrated in FIG. 5 as a continuous disc, one or both of the grounding elements 208a and 208b can be discontinuous (e.g., as shown in FIG. 1) with one or more groups of grounding elements connected together. Additionally, or alternatively, the grounding elements 208a and 208b can be, or can include rings, and can be connected around a perimeter.

The exemplary monopole arrays 104 and 204, and/or the grounding elements 208a, can be configured and/or structure in a number of different orientations and/or shapes, such as but not limited to, rectangular, elliptical, etc. The exemplary shape(s) and configuration(s) of the exemplary monopole arrays 104 and 204 can be varied based on the desired objects to be scanned with the exemplary system 100.

Exemplary System Using Monopole Array

Figure 7:
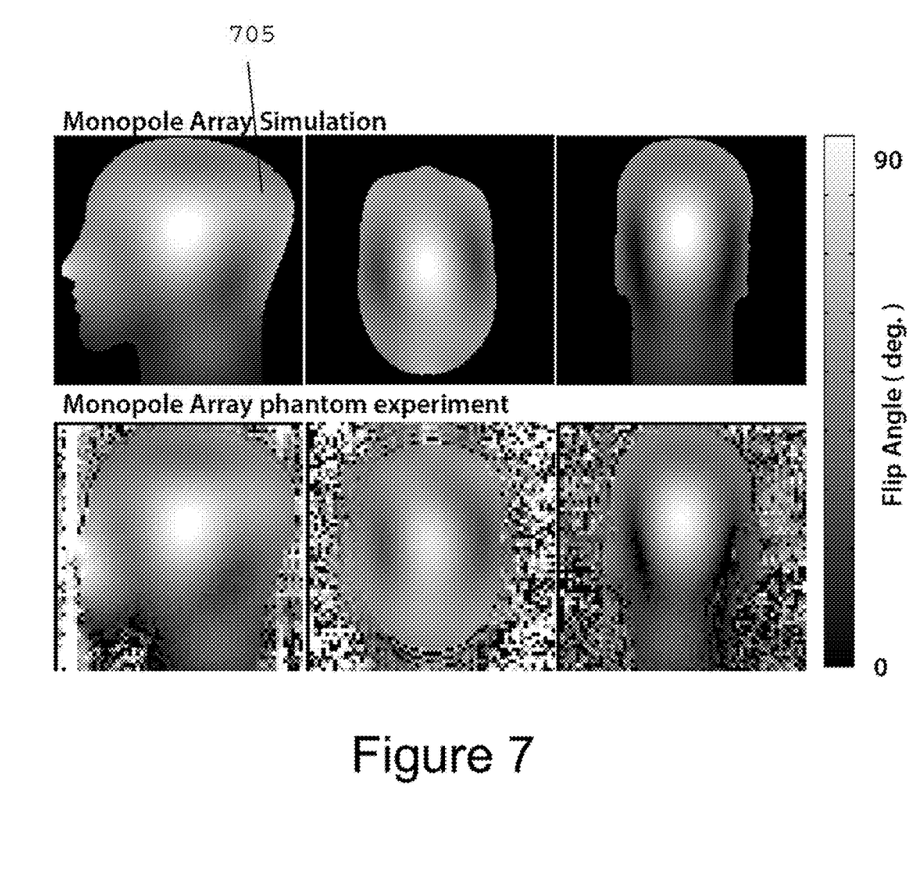
FIG. 7 is a set of images of exemplary B1+ maps of a simulation of the exemplary monopole array and an experimental test of the monopole array generated using the exemplary system shown in FIG. 6.

FIG. 7 shows a block diagram of an exemplary embodiment of the system 100 of FIG. 1 according to an exemplary embodiment of the present disclosure. For example, exemplary procedures in accordance with the present disclosure described herein can be performed by a processing arrangement and/or a computing arrangement 710 and a monopole array arrangement 780. Such processing/computing arrangement 710 can be, for example, entirely or a part of, or include, but not limited to, a computer/processor 720 that can include, for example, one or more microprocessors, and use instructions stored on a computer-accessible medium (e.g., RAM, ROM, hard drive, or other storage device).

As shown in FIG. 7, for example, a computer-accessible medium 730 (e.g., as described herein above, a storage device such as a hard disk, floppy disk, memory stick, CD-ROM, RAM, ROM, etc., or a collection thereof) can be provided (e.g., in communication with the processing arrangement 710). The computer-accessible medium 730 can contain executable instructions 740 thereon. In addition or alternatively, a storage arrangement 750 can be provided separately from the computer-accessible medium 730, which can provide the instructions to the processing arrangement 710 so as to configure the processing arrangement to execute certain exemplary procedures, processes and methods, as described herein above, for example.

Further, the exemplary processing arrangement 710 can be provided with or include an input/output arrangement 770, which can include, for example, a wired network, a wireless network, the internet, an intranet, a data collection probe, a sensor, etc. As shown in FIG. 7, the exemplary processing arrangement 710 can be in communication with an exemplary display arrangement 760, which, according to certain exemplary embodiments of the present disclosure, can be a touch-screen configured for inputting information to the processing arrangement in addition to outputting information from the processing arrangement, for example. Further, the exemplary display 760 and/or a storage arrangement 750 can be used to display and/or store data in a user-accessible format and/or user-readable format.

Examples of Monopole Array and Experimentation Results

Exemplary coil designs of the monopole arrays 104 and 204 were evaluated in simulation. Finite different time domain ("FDTD") simulations were performed with Microwave Studio (e.g., CST, Framingham, Mass.). In one example, the exemplary coil was modeled on a 27.9 cm diameter cylinder loaded with a head shaped phantom with uniform electrical properties (e.g., $\epsilon_r$=52, σ=0.56). In this example, the exemplary monopole antenna elements 106a-106h were about 18 cm in length were arranged similarly to the rungs on a birdcage. Each monopole element 106a-106h was T-shaped, with about 18.6 cm length of conductor extending around the cylinder which can act as a partial shield, with alternating monopoles antennas 110 oriented in opposite directions. (See, e.g., FIGS. 1 and 2). A lumped element inductor of about 60.5 nH was included between the monopole element 106a-106h, and its shield conductor, and it was driven with an about 50'Ω port. All elements were tuned and matched in the simulation.

An exemplary 8 channel array 104 was constructed based on the exemplary simulated design. (See e.g., FIG. 2). Monopole lengths 106a-106h were extended to about 19 cm, and about 71 nH inductors were chosen based on bench measurements. Each element was matched using a parallel capacitor, and 2 or 3 cable traps were used in the coaxes feeding each antenna 110. For elements driven from the patient end of the coil array 104, the cables were routed back over the coil through 3 cable traps. The coil was interface to a 7T scanner with an 8 channel parallel transmit (e.g., by Siemens, Erlangen Germany) using a transmit-receive interface. Data was obtained on a gel phantom (e.g., an artificial test subject) with the same shape and properties used in the simulations and with a human test subject after establishing safe power limits on the gel phantom using magnetic resonance ("MR") thermometry. Phases to the elements were chosen to create a constructive interference at the center of the phantom. B1+ maps were obtained with a turbo-FLASH sequence with preparation pulse, and G-factor maps were calculated based on GRE measurements obtained with RF excitation and without (e.g., TR/TE/BW=200/4.1/300, FOV=220 mm, Matrix=256, Slice=3 mm). The exemplary monopole array 104 was also compared to an 8 channel array of meander-shortened dipoles.

Figure 8:
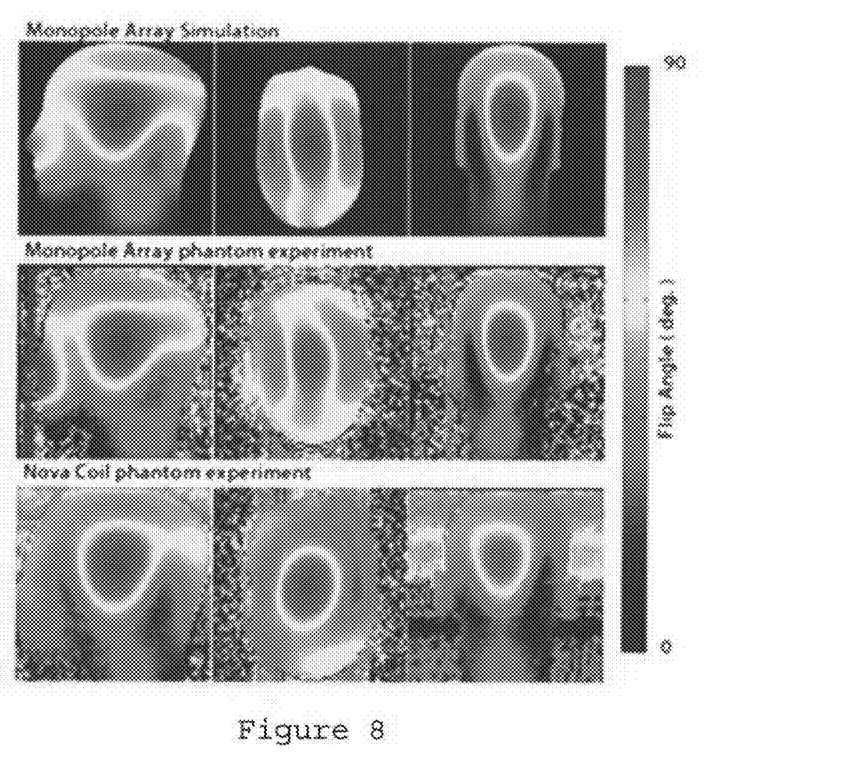
FIG. 8 is a set of images of additional exemplary B1+ maps of the exemplary monopole array and Nova Medical birdcage coil in simulation generated using the exemplary system shown in FIG. 6.

An approximately 60.5 nH inductor was inserted between the element and the T-segment to achieve resonance at about 297.2 MHz. As shown in FIG. 3, stronger current flows ("HC") on the monopole element than on the T segment ("LC"), illustrating that the T-shaped monopole behaves similarly to a monopole with a real ground plane. S11 of about −16 dB or better was achieved on all elements, and maximum S12 coupling was about −9 dB. B1+ maps for quadrature excitation in simulation and head shaped gel phantom experiment are shown in FIGS. 7 and 8. There is weaker excitation in the region of the cerebellum 705, but the pattern can be comparable to what can be seen with the Nova volume coil. 10 g peak local SAR for monopole array can be about 1.352 w/kg, and about 1.428 w/kg for the 8 channel array of meander-shortened dipoles.

Figure 9:
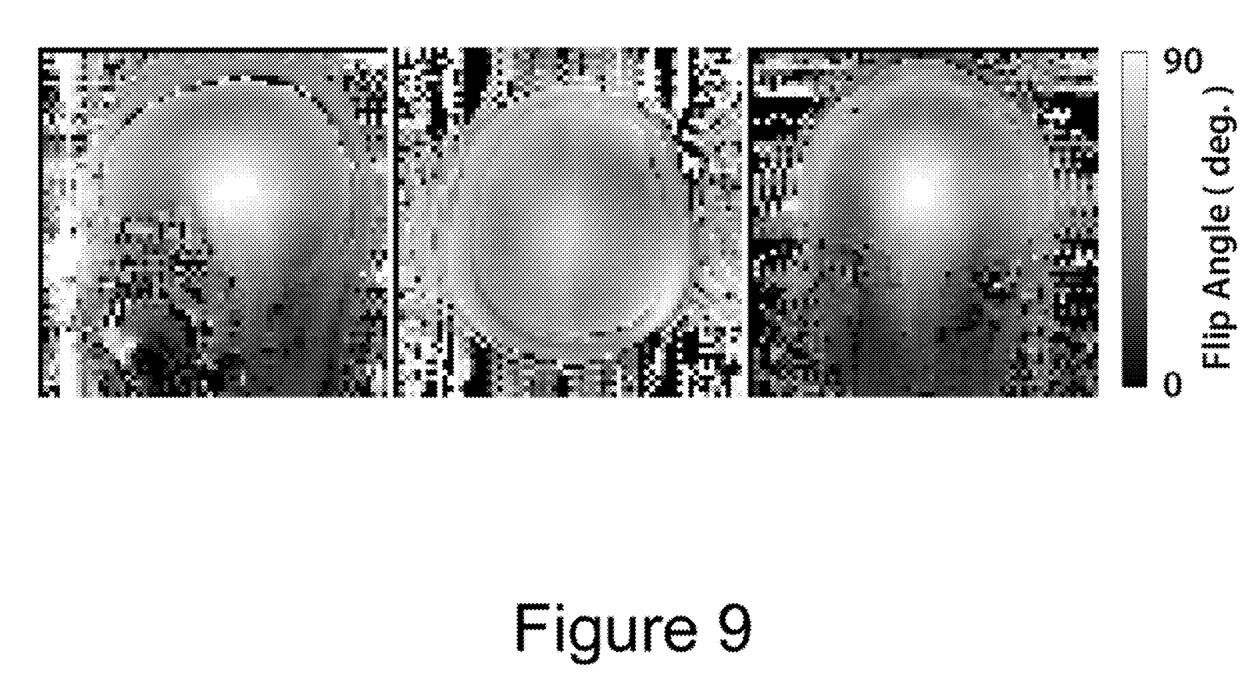
FIG. 9 is a set of illustrations of further exemplary B+1 maps of the exemplary monopole array used on a person generated using the exemplary system shown in FIG. 6.
Figure 10A:
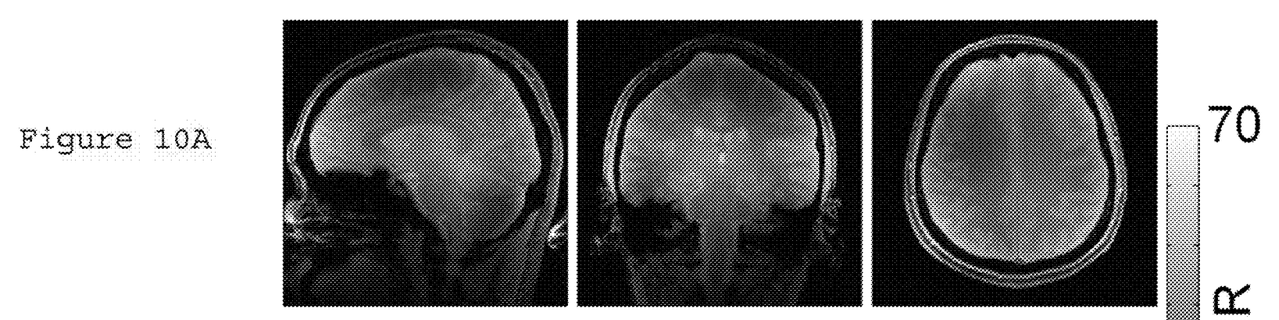
FIG. 10A is a set of images of exemplary signal-to-noise ratio ("SNR") maps of the exemplary monopole array generated using the exemplary system shown in FIG. 6.
Figure 10B:
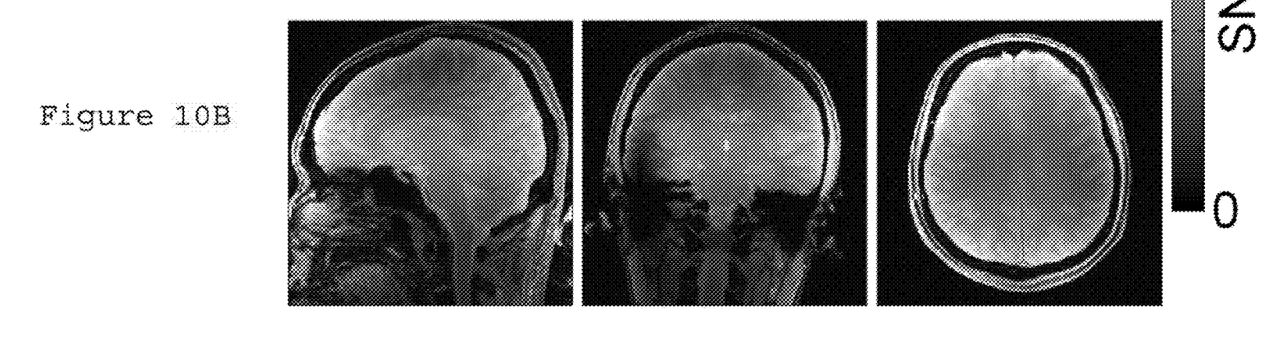
FIG. 10B is a set of images of exemplary SNR maps of an exemplary dipole array generated using the exemplary system shown in FIG. 6.
Figure 11A:
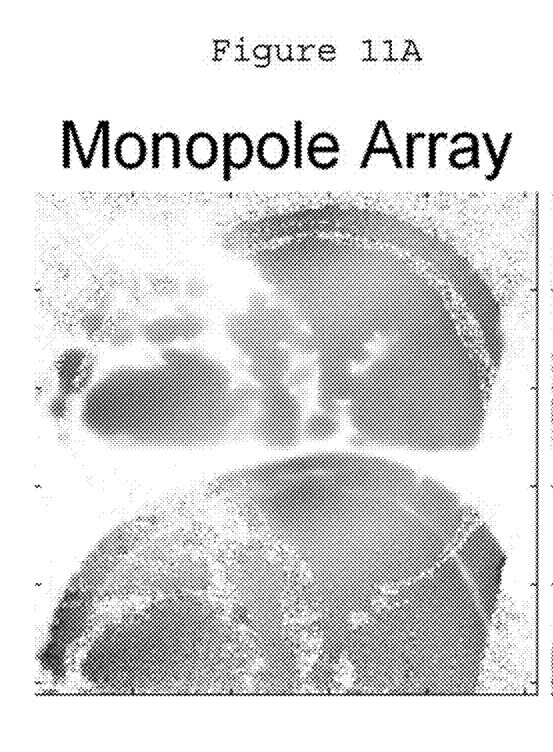
FIG. 11A is an image of exemplary g-factor values for an exemplary monopole array according to an exemplary embodiment of the present disclosure.
Figure 11B:
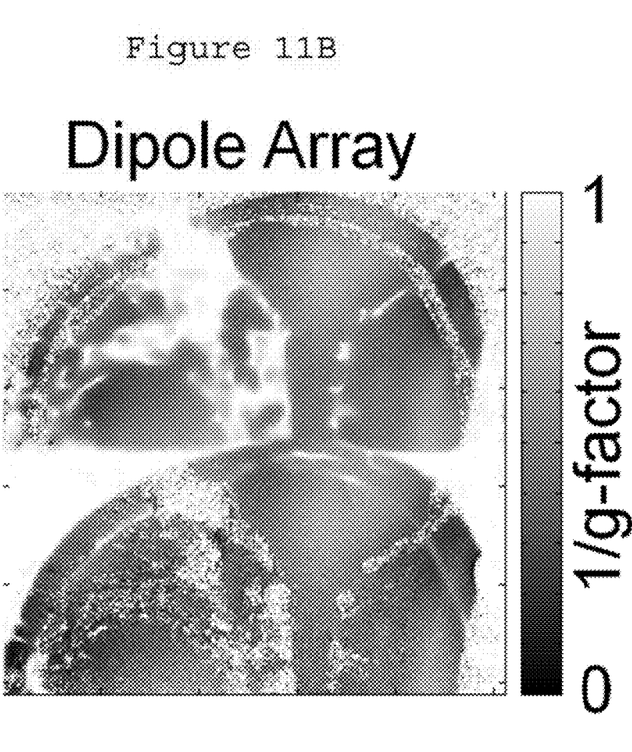
FIG. 11B is an image of exemplary g-factor values for an exemplary dipole array according to an exemplary embodiment of the present disclosure.

In the exemplary coil, each element showed a current maximum at the drive point and gradual current drop off along the length. When loaded with the head shaped gel phantom a 90 degree flip angle can be achieved with the single channel equivalent of a 225 v 500 ms hard pulse. This increased to 326 v with a volunteer, as compared to 235 v with the Nova Medical birdcage coil. B1+ maps obtained in the volunteer are shown in FIG. 9. The excitation in inferior brain regions can be improved as compared to the data presented for the single ended monopole array in ref 5. SNR maps for optimal reconstruction from volunteer data are shown in FIG. 10. The long elements of the dipole array provide higher SNR in the cerebellum, but both arrays can achieve similar central SNR values. G factor maps for the monopole array and a dipole array are shown in FIG. 11. The diversity in Z-profiles for the oppositely driven monopole elements can be demonstrated by the lower G-factors for this coil with head-foot acceleration.

The use of monopoles can facilitate a more compact coil design, and the variation of B1 profiles along Z can be helpful both for G-factors in receive, and for parallel transmit pulse design. SNR can be substantially improved by inclusion of a close fitting receive array.

The foregoing merely illustrates the principles of the disclosure. Various modifications and alterations to the described embodiments will be apparent to those skilled in the art in view of the teachings herein, and especially in the appended numbered paragraphs. It will thus be appreciated that those skilled in the art will be able to devise numerous systems, arrangements, and methods which, although not explicitly shown or described herein, embody the principles of the disclosure and are thus within the spirit and scope of the disclosure. In addition, all publications and references referred to above are incorporated herein by reference in their entireties. It should be understood that the exemplary procedures described herein can be stored on any computer accessible medium, including a hard drive, RAM, ROM, removable disks, CD-ROM, memory sticks, etc., and executed by a processing arrangement which can be a microprocessor, mini, macro, mainframe, etc. In addition, to the extent that the prior art knowledge has not been explicitly incorporated by reference herein above, it is explicitly being incorporated herein in its entirety. All publications referenced above are incorporated herein by reference in their entireties.

EXEMPLARY REFERENCES

The following references are hereby incorporated by reference in their entirety.
[1] Wiggins G C. ISMRM 2012 p 541.
[2] Wiggins G C. ISMRM 2013 p 2737.
[3] Schnell W. (2000), IEEE Trans Ant Prop 48:418-28.
[4] Lattanzi R. Magn Reson Med 2012 68:286-304.
[5] Suk-Min Hong. MRM 2013 doi: 10.1002/mrm. 24844.
[6] Klose U, Med. Phys. 19(4), 1992.

What is claimed is:
1. A monopole array, comprising:
 a first monopole element including at least one first antenna element, and a first grounding element in communication with the at least one first antenna element; and
 a second monopole element including at least one second antenna element, and a second grounding element in communication with the at least one second antenna element;
 wherein the at least one first antenna element is oriented in a first direction, and the at least one second antenna element is oriented in a second direction that is different from the first direction.

2. The monopole array of claim 1, wherein the at least one first antenna element extends in a direction that is substantially perpendicular to a direction of extension of the first grounding element, and wherein the at least one second antenna element extends in a direction that is substantially perpendicular to a direction of extension of the second grounding element.

3. The monopole array of claim 1, wherein the at least one first antenna element is coupled to the first grounding element using a first fitting, and the at least one second antenna element is coupled to the second grounding element using a second fitting.

4. The monopole array of claim 1, wherein the at least one first antenna element includes a plurality of first antenna elements spaced apart from one another along the first grounding element, and the at least one second antenna element includes a plurality of second antenna elements spaced apart along the second grounding element.

5. The monopole array of claim 1, wherein the first grounding element includes a space configured to facilitate an anatomical object to pass therethrough.

6. The monopole array of claim 1, wherein the first and second monopole elements are configured to at least one of transmit or receive at least one magnetic resonance signal.

7. The monopole array of claim 1, further comprising at least one computer arrangement configured to receive magnetic resonance information from at least one of the first monopole element or the second monopole element, and generate at least one image based on the information.

* * * * *